United States Patent [19]

Tan

[11] Patent Number: 5,436,570

[45] Date of Patent: Jul. 25, 1995

[54] BURN-IN TEST PROBE FOR FINE-PITCH PACKAGES WITH SIDE CONTACTS

[76] Inventor: Yin L. Tan, Block 22, #25-182 St. George's Road, Singapore 1232, Singapore

[21] Appl. No.: 120,688

[22] Filed: Sep. 13, 1993

Related U.S. Application Data

[63] Continuation-in-part of Ser. No. 703,837, May 21, 1991, abandoned.

[51] Int. Cl.⁶ .................................................. G01R 1/00
[52] U.S. Cl. ...................................... 324/761; 324/73.1
[58] Field of Search ............... 324/158 F, 158 P, 72.5, 324/761; 439/482, 70, 71

[56] References Cited

U.S. PATENT DOCUMENTS

| | | | |
|---|---|---|---|
| 3,731,191 | 5/1973 | Bullard et al. | 324/158 F |
| 3,906,363 | 9/1975 | Fowler | 324/158 F |
| 4,460,236 | 7/1984 | Strautz | 339/176 M |
| 4,554,506 | 11/1985 | Faure et al. | 324/158 |
| 4,846,702 | 7/1989 | Ignasiak et al. | 439/71 |
| 4,952,872 | 8/1990 | Driller et al. | 324/158 F |
| 4,978,912 | 12/1990 | Vonder et al. | 324/158 P |
| 5,122,070 | 6/1992 | Lebris et al. | 439/140 |

FOREIGN PATENT DOCUMENTS

WO8803651  5/1988  WIPO ............................. 324/158 P

*Primary Examiner*—Vinh Nguyen

[57] ABSTRACT

A splay-free test probe for maintaining high conductivity is described. A matrix of electrical pins are molded into the side walls of a probe head. The side surfaces of the probe head are milled such that the longitudinally exposed surfaces of the exposed pins are flushed with the side surfaces of the probe head. The longitudinal exposed surfaces of the pins become the contact surfaces of the test probe. The width of the contact surfaces is less than 50% of the cross-sectional diameter of the pins. Notwithstanding repeated insertions, the test probe ensures splay-free performance. The contact surfaces around the tips of the stainless steel pins are milled at an angle with respect to plane of the side walls of the probe head to facilitate the probe head's entry into the IC socket. While the probe head is inserted into IC socket, the stainless steel contact surfaces of the probe head remove contaminants from the socket pins. In the process, the electrical contact between the IC sockets and the IC pins is improved. The test probe not only can be customized to any specification of IC sockets, but it also ensures that the cross-sectional dimension and electrical conductivity of the IC package is accurately and reliably simulated.

6 Claims, 5 Drawing Sheets

BURN-IN TEST PROBE FOR FINE-PITCH PACKAGES WITH SIDE CONTACTS

This is a continuation in part of application Ser. No. 07/703,837, filed on May 21, 1991, now abandoned.

BACKGROUND OF THE INVENTION

1. Field of the Invention

This invention relates to test probe for Integrated circuit (IC) socket, and in particular, to a reliable and precise test probe for testing and simulating IC sockets as part of the IC burn-in testing.

2. Description of the Related Art

Test probes are used widely in verifying the integrity of the connection between the IC sockets and the circuit boards on which the IC sockets are permanently mounted. First, a test probe is coupled electrically to a testing equipment. Second, the IC device is removed from the IC socket. The other end of the test probe takes the place of the IC device in the socket. Finally, the IC socket and circuit board assembly is tested for proper operation. By burn-in testing, the present invention refers to the simulation of the performance of the IC socket and circuit board assembly in high temperatures ranges.

Much attention has been devoted to the reliability and features of testing equipments used in the testing cycle. It is only recently that the characteristics of the test probe interface began to receive the attention they deserve in the overall quality control process of fabricating IC devices. The increasing failure rates of high value processor and memory chips have prompted the testing professionals to take a closer look at the specifications, reliability, precision and ergonomics of the probing devices because the aforementioned variables are likely sources of errors in the testing process.

Prior art test probes for IC sockets have contact surfaces designed in one of two ways: (1) conductive strips etched on printed circuit boards which are bonded to the side walls of a hard plastic body, or (2) conductive strips laminated onto the side walls of a hard plastic body to serve, such as in the probe design disclosed by Vonder et al in U.S. Pat No, 4,978,912, The contact surfaces of prior art test probes tend to splay with repeated insertions—a common experience of human operators using them in the burn-in test process. Moreover, the material of the electrical contact surfaces in the prior art probe designs is usually beryllium copper plated with nickel to reduce wear and tear. With repeated insertions, the protective nickel layers wear out. The exposed copper base oxidises easily and results in higher electrical resistance of the contact surfaces. A test probe which is splayed and worn not only fails to simulate the physical dimensions of the IC device, but also introduces errors into the electrical test parameters.

SUMMARY OF THE INVENTION

The present invention discloses a splay-free test probe which maintains high conductivity with repeated insertions.

A plurality of electrical pins are molded into the side walls of a probe head. The side surfaces of the probe head are milled such that the longitudinally exposed surfaces of the exposed pins are flushed with the side surfaces of the probe head. The longitudinal exposed surfaces of the pins become the contact surfaces of the test probe. The width of the contact surfaces is less than 50% of the cross-sectional diameter of the pins. Notwithstanding repeated insertions, the present invention ensures splay-free performance.

The electrical pins are made of stainless steel as opposed to beryllium copper. Although the electrical conductivity of stainless steel is not as high as that of prior art choices, it falls within the U.S. military specifications for IC pin conductivity.

The contact surfaces around the tips of the stainless steel pins are milled at an angle with respect to plane of the side walls of the probe head to facilitate the probe head's entry into the IC socket. While the probe head is inserted into IC socket, the stainless steel contact surfaces of the probe head remove contaminants from the socket pins. In the process, the electrical contact between the IC sockets and the IC pins is improved.

The present invention not only can be customized to any specification of IC sockets, but it also ensures that the cross-sectional dimension and electrical conductivity of the IC package is accurately and reliably simulated.

DETAILED DESCRIPTION OF THE INVENTION

Figure 1:
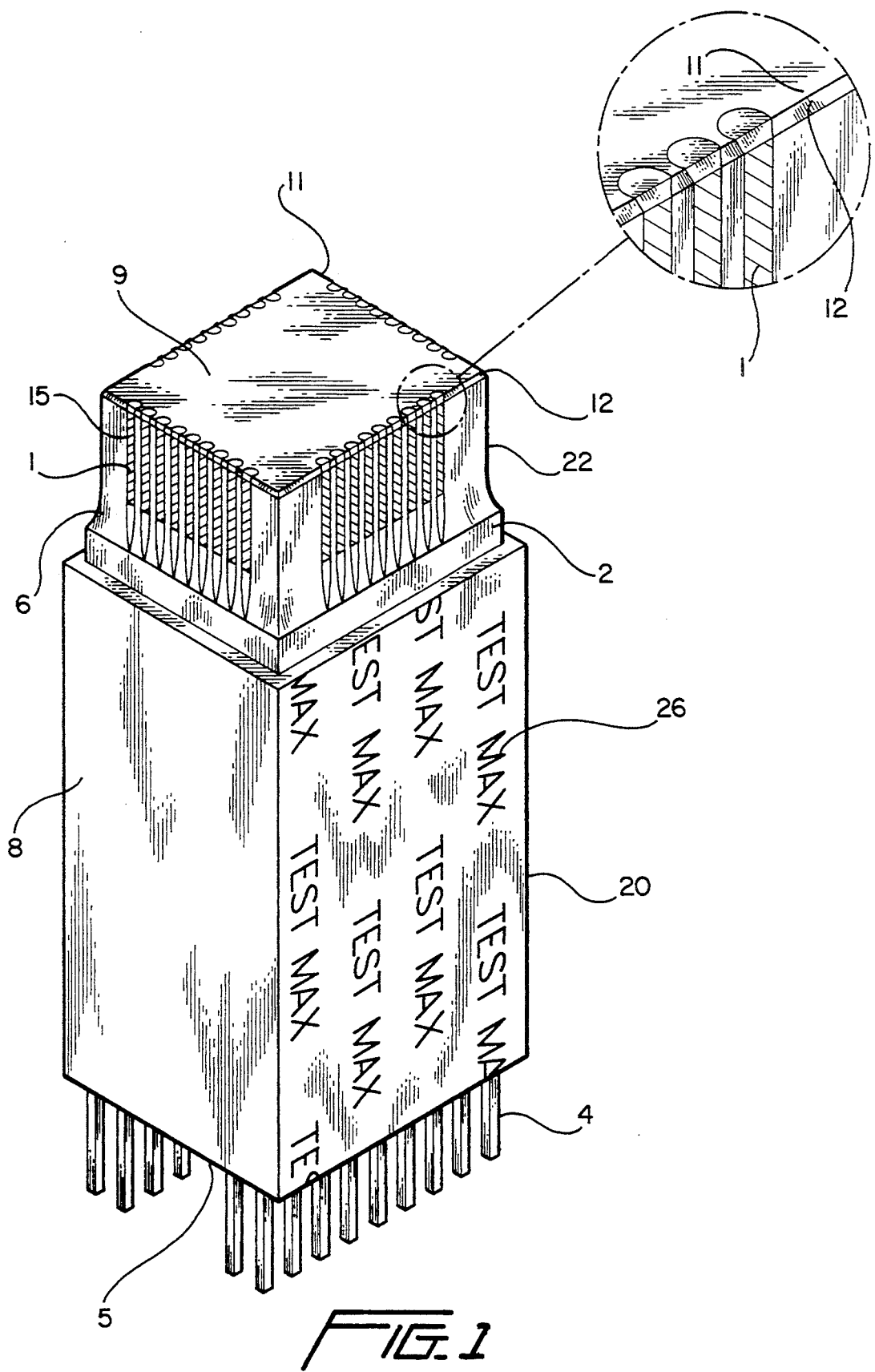
FIG. 1 is a perspective elevational view of a test probe in accordance with the present invention showing the embedding of splay-free electrical pins having contact surfaces on the side walls of the probe head.

FIG. 1 is a perspective elevational view of a test probe in accordance with the present invention. The test probe comprises a test body 20 and a test head 22. The test body 20 has four side walls 3 defining an internal space. One end of the test body 20 is coupled to the test head 22 while the other end of the test body is the testing end 5 (to be described in detail in FIG. 2). The outer surface 26 of the side walls 3 are embossed while the other outer surface 8 remains unembossed, The unembossed surface 8 serves as an indexing means to orient the test probe correctly before it is used for testing and simulating IC sockets and devices.

Figure 5:
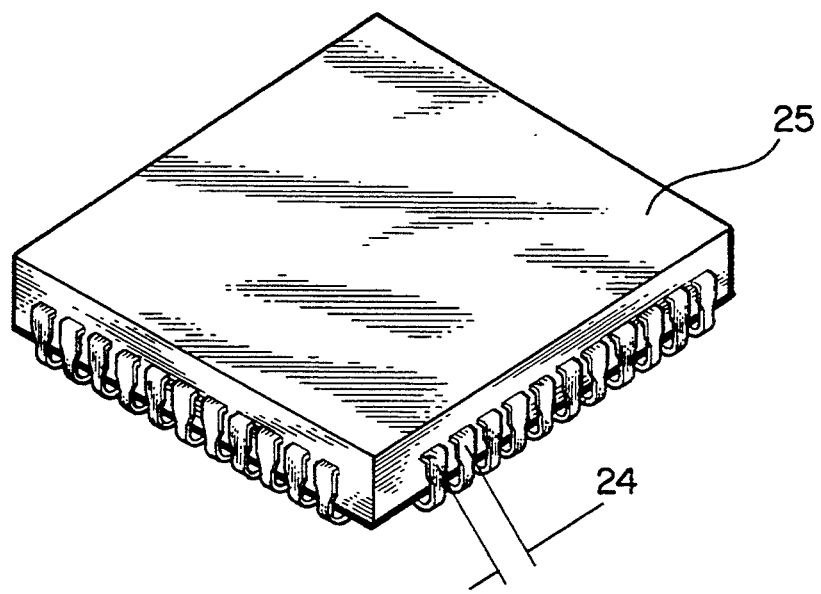
FIG. 5 is a perspective elevational view of a pine-pitch IC device and a cross-sectional side elevational view of the it inserted in a upside down direction (or dead bug) into an IC socket.
Figure 5:
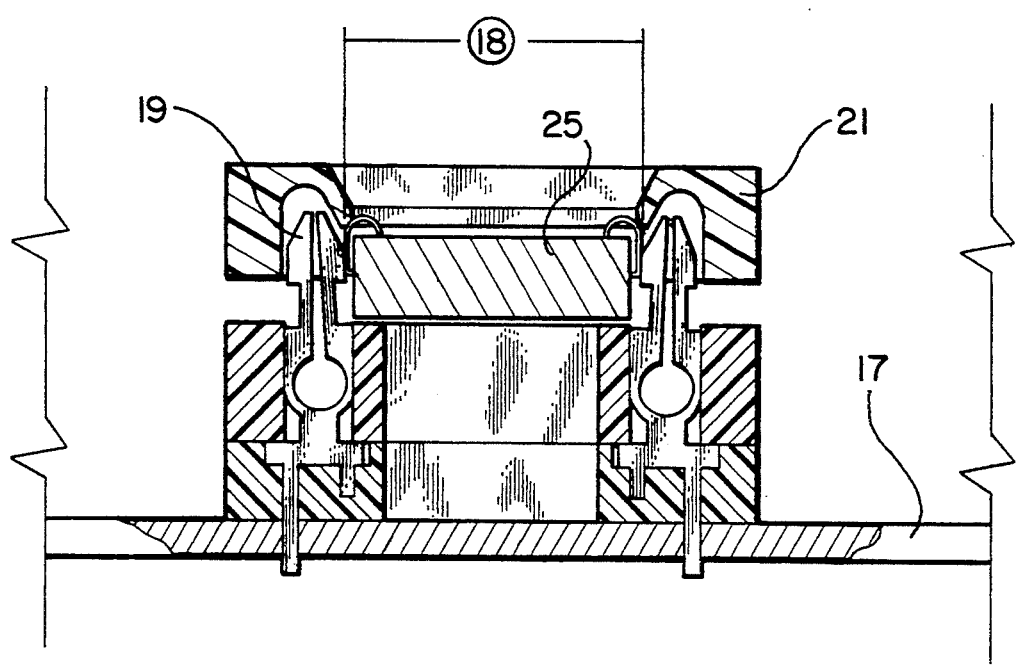

Referring again to FIG. 1, the probe head 22 comprising a block of resin with a solid core 9 and four side walls 2. The side walls 2 comprise printed circuit boards having a plurality of stainless steel pins 15 embedded therein. The embedded pins 15 are arranged such that they are parallel to each other and parallel to the longitudinal axis of the contact pins from the IC sockets (not shown in FIG. 1). In the preferred embodiment of the present invention, the side walls 2 are molded with resin compound to form the probe head 22. It should be understood by one skilled in the art that other synthetic compounds may be used to mold the side walls into a probe head. Although all side walls in FIG. 1 are embedded with pins 15, it should be understood by one skilled in the art that the side walls 2 may be customized to any specification of IC sockets. For instance, a two-sided contact IC package requires that only two side walls 2 be embedded with pins 15. With respect to the probe head 22 in FIG. 1, it is customized for a four-sided contact IC package such as the fine-pitch IC device as illustrated in FIG. 5.

In FIG. 1 the side walls 2 are each milled to expose a portion of the longitudinal surfaces 1 of the embedded stainless steel pins 15. The longitudinal surfaces 1 are flushed with the milled surface of the side walls 2. Furthermore, the longitudinal surfaces 1 are also the contact surfaces of the probe head 22. For the rest of the description of the present invention, the exposed, longitudinal surfaces of the embedded pins are interchangeable with the contact surfaces of the probe heard. The width of the contact surfaces 1 is preferably less than 50% of the cross-sectional diameter of the embedded pins 15. It is determined that contact surfaces of embedded pins 15 having such width limitation are splay-free notwithstanding repeated insertion of the test probe. The exposed tips of the embedded pins terminate with the exposed end 11 of the probe head 22. The exposed end 11 is substantially perpendicular to longitudinal axis of the embedded pins 15. Preferably, a portion of the interface between the exposed end 11 and the milled side walls 2 are bevelled to approximately 45 degrees relative to the plane of the exposed end 11. The bevelled edges 12 of the exposed end 11 of the probe head remove contaminants from the contact pins of the IC sockets (not shown in FIG. 1) whenever the probe head is inserted into the IC socket. Not only is the life of the socket pins prolonged but the conductivity between the probe head and IC socket is maintained.

Figure 2:
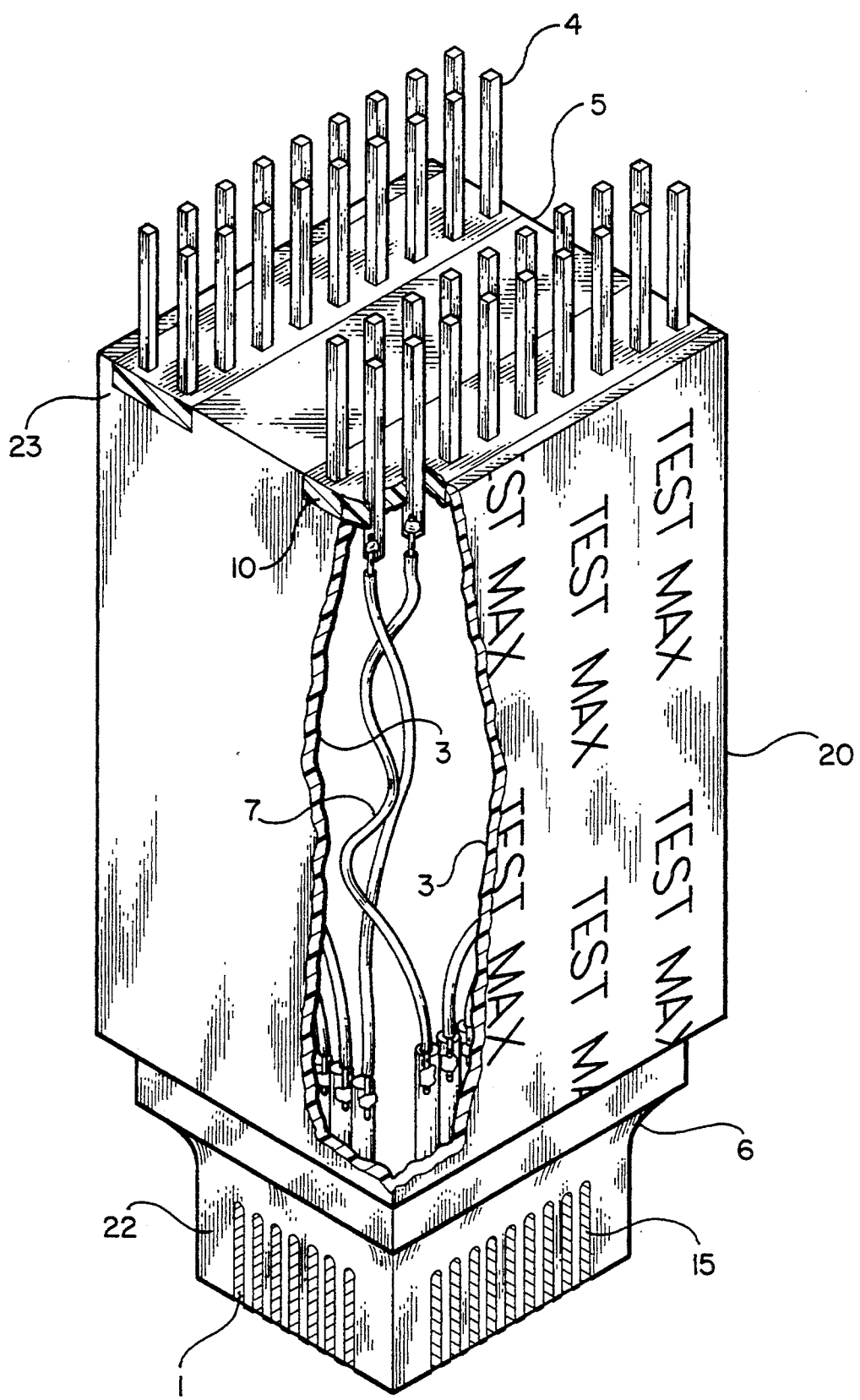
FIG. 2 is a perspective cut-away view of the probe body in accordance with the present invention showing the internal connections between unexposed ends of the pins on the probe head on the one hand and unexposed ends of the test terminals on the testing end on the other hand.

FIG. 2 is a perspective cut-away view of the probe body 20 illustrating the internal connection between unexposed ends of the embedded pins 15 on the probe head 22 on the one hand and unexposed ends of the test terminals 4 on the testing end 5 on the other hand. A plurality of wires 7 connect the embedded pins and the corresponding test terminals 4. In the preferred embodiment of the present invention, the testing end 5 of the probe body 20 comprises a plurality of slots 23 for accommodating cable connection headers 10 in FIG. 2 two headers 10 with 18 test terminals are shown, The side walls 3 of the probe body 20 are preferably made of insulative anti-static resin.

Figure 3:
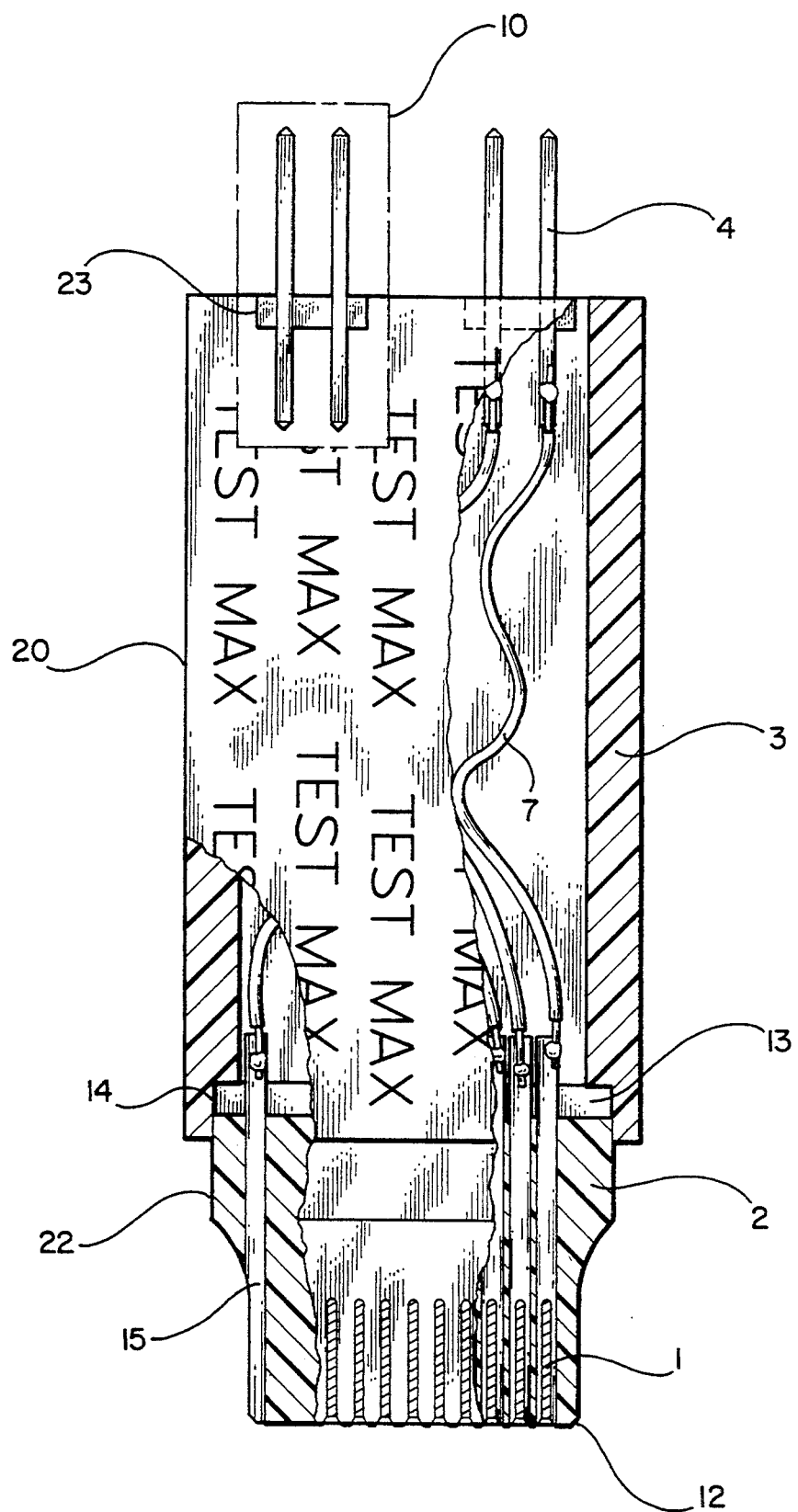
FIG. 3 is a cross-sectional, right side elevational view of the test probe as shown in FIG. 2.

FIG. 3 is a cross-sectional, right side elevational view of the test probe as shown in FIG. 2. The interface between the probe body 20 and the probe head 22 is highlighted. A matching slot 14 in the open end (opposite the testing end) of the probe body 20 receives the test probe 22. Preferably, adhesive gel 13 bonds the probe body and the probe head. Thermal setting resin (not shown) is injected into the internal space defined by the side walls 3, the testing end 5 and the probe head. The resin minimizes vibration within the probe body.

Figure 4:
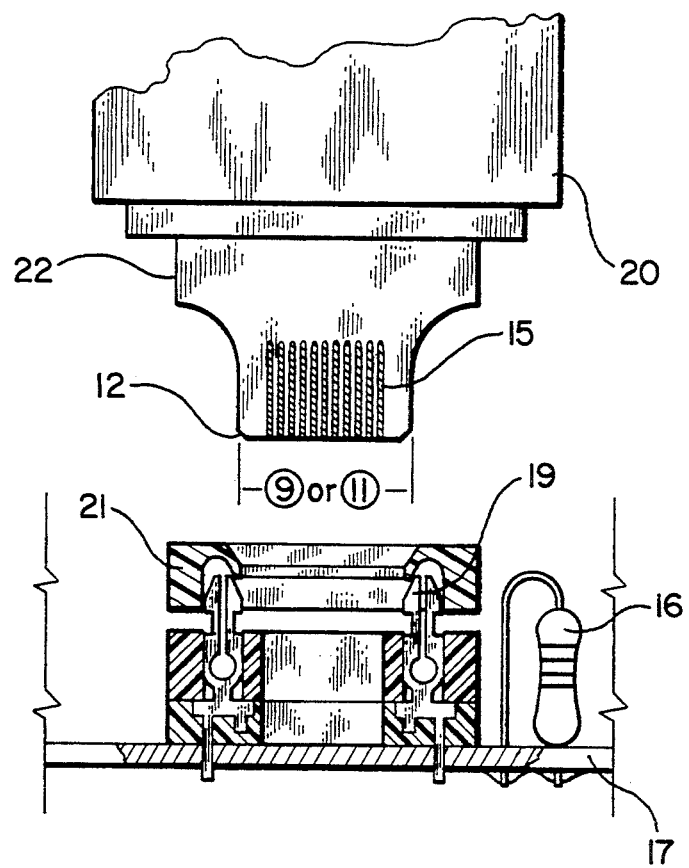
FIG. 4 is a cross-sectional side elevational view of the IC socket and perspective side elevational view of the probe head before and during insertion of the probe head into the IC socket.
Figure 4:
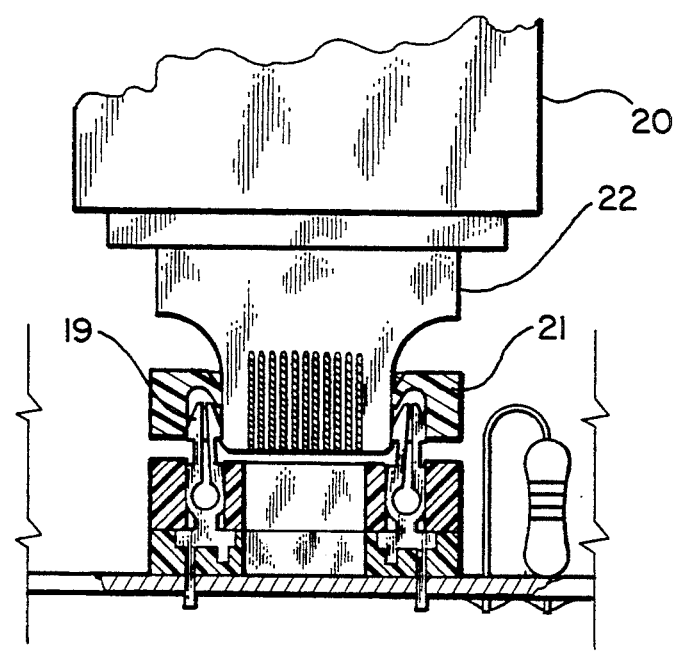

FIG. 4 is a cross-sectional side elevational view of the IC socket 21 and perspective side elevational view of the probe head 22 before and during insertion of the probe head into the IC socket. The socket 21 is preferably mounted permanently onto a burn-in board 17. In general, the dimension of the probe head 22 approximates that of the actual IC package to be tested. First, the test probe must simulate the pin-to-pin pitch 24 of IC devices (such as that shown in FIG. 5) while meeting the specifications of the between-pin impedances. This requirement becomes more difficult to achieve with high density pin configurations such as that in VLSI packages 25 as shown in FIG. 5. The pitch values may approach 25 millimeter or less. The test probe of the present invention is designed to achieve a minimum between-pin impedance of 30 millimeter which is necessary to check low circuit board capacitances.

While the present invention has been described particularly with reference to FIGS. 1 to 5 with emphasis on a test probe for testing and simulating IC sockets where it is mounted permanently on burn-in circuit boards, it should be understood that the figures are for illustration only and should not be taken a limitation on the invention. In addition, it is clear that the apparatus of the present invention has utility in many applications where reliable and precise testing and simulation of IC devices is required. It is contemplated that many changes and modifications may be made by one of ordinary skill in the art without departing from the spirit and the scope of the invention as described.

I claim:

1. A test probe for testing a socket of an IC device and the circuit board on which the IC socket is mounted, said IC socket having a plurality of socket pins, said socket pins being deposited with contaminants, said test probe comprises:
   a body portion with a head at one end and header at the other end, said body defining a space having at least four side walls, at least one of said side walls being unembossed;
   said head configured for insertion into and mating with said IC socket said head having at least four side walls;
   a plurality of electrical pins embedded into the side walls of said head said electrical pins being milled such that the exposed surfaces of a portion of said pins are flush with the side walls of said head, said exposed surfaces forming the contact points for simulating the pins of an IC device;
   a plurality of electrical conductors on said header each attaching to at least one end of said electrical pins internally of the said body portion; and
   whereby the one unembossed side of the said body serves as an indexing means to orient the said test probe to the said IC socket.

2. A test probe as in claim 1 wherein said head and said space of body are filled with impact-resistant resin.

3. A test probe as in claim 1 wherein said side walls of said body are made of insulative anti-static resin.

4. A test probe as in claim 1 wherein each electrical pins is made of stainless steel.

5. A test probe as claimed in claim 1 wherein: the exposed surface of said electrical pins measured widthwise and longitudinally is less than 50% of the cross sectional diameter of said electrical pins.

6. A test probe as claimed in claim 1 wherein: the exposed surfaces of each said electrical pins terminate at an bevelled angle relative to the corresponding side plane of said head to ease the insertion of said test probe into said IC socket and to scrape contaminants off the pins of said IC socket.

* * * * *